United States Patent
Yang et al.

(10) Patent No.: US 11,708,643 B2
(45) Date of Patent: Jul. 25, 2023

(54) METHOD AND APPARATUS FOR MANUFACTURING MONOCRYSTALLINE SILICON

(71) Applicants: ZHEJIANG JINKO SOLAR CO., LTD, Haining (CN); JINKO SOLAR CO., LTD., Jiangxi (CN)

(72) Inventors: Jun Yang, Haining (CN); Weize Shang, Haining (CN); Xiaolong Bai, Haining (CN)

(73) Assignee: Shangrao Jinko solar Technology Development Co., LTD, Jiangxi (CN)

( * ) Notice: Subject to any disclaimer, the term of this patent is extended or adjusted under 35 U.S.C. 154(b) by 0 days.

(21) Appl. No.: 17/005,891

(22) Filed: Aug. 28, 2020

(65) Prior Publication Data
US 2022/0042203 A1 Feb. 10, 2022

(30) Foreign Application Priority Data
Aug. 4, 2020 (CN) .......................... 202010772111.X

(51) Int. Cl.
*C30B 15/20* (2006.01)
*C30B 15/04* (2006.01)
(Continued)

(52) U.S. Cl.
CPC ............. *C30B 15/20* (2013.01); *C30B 15/04* (2013.01); *C30B 15/14* (2013.01); *C30B 29/06* (2013.01)

(58) Field of Classification Search
CPC ......... C30B 15/20; C30B 15/04; C30B 15/14; C30B 29/06
See application file for complete search history.

(56) References Cited

U.S. PATENT DOCUMENTS

2002/0144641 A1* 10/2002 Inagaki .................. C30B 29/06
117/13
2003/0150373 A1* 8/2003 Kubo ..................... C30B 15/14
117/13
(Continued)

FOREIGN PATENT DOCUMENTS

CN       200958129 Y    10/2007
CN       101575731 A    11/2009
(Continued)

OTHER PUBLICATIONS

First Office Action, Chinese Application No. 202010772111.X, dated Sep. 18, 2020.
(Continued)

*Primary Examiner* — Hua Qi
(74) *Attorney, Agent, or Firm* — Pillsbury Winthrop Shaw Pittman, LLP; Chad Hammerlind

(57) ABSTRACT

A method for manufacturing a monocrystalline silicon with Czochralski process, including: providing polycrystalline silicon and dopant to quartz crucible in single crystal furnace and vacuumizing, melting the polycrystalline silicon under protective gas to obtain silicon melt; after temperature of the silicon melt is stable, immersing seed crystal into the silicon melt to start seeding, lifting a shield away from surface of the silicon melt to adjust distance between the shield and the silicon melt to first preset distance; after seeding, performing shouldering to pull the crystal to increase diameter of the crystal to preset width; starting constant-diameter body growth, lowering the shield towards the surface of the silicon melt to adjust the distance to second preset distance; after growth, entering a tailing stage during which the diameter of the crystal is reduced until the crystal is separated from the silicon melt; and cooling the crystal to obtain monocrystalline silicon.

10 Claims, 3 Drawing Sheets

(51) Int. Cl.
*C30B 15/14* (2006.01)
*C30B 29/06* (2006.01)

(56) References Cited

U.S. PATENT DOCUMENTS

2011/0259260 A1* 10/2011 Takanashi ............... C30B 29/06
117/15
2012/0279438 A1* 11/2012 Ryu ...................... C30B 15/203
117/35

FOREIGN PATENT DOCUMENTS

| CN | 102839415 A | * | 12/2012 |
| CN | 102839415 A | | 12/2012 |
| CN | 103451721 A | | 12/2013 |
| CN | 104313682 A | | 1/2015 |
| CN | 105442037 A | | 3/2016 |
| CN | 105603520 A | | 5/2016 |
| CN | 205711031 U | | 11/2016 |
| CN | 207452295 U | | 6/2018 |
| CN | 109306511 A | | 2/2019 |
| CN | 209974965 U | | 1/2020 |
| CN | 111139520 A | | 5/2020 |
| DE | 20118092 U1 | | 4/2002 |
| DE | 112010002568 B4 | | 1/2017 |
| EP | 1158076 A1 | | 11/2001 |

OTHER PUBLICATIONS

Extended European Search Report, European Application No. 20193393.4, dated Dec. 16, 2020.
First Office Action, Chinese Application No. 202010772111.X, dated Sep. 18, 2020, 6 pages.
First Office Action (English Translation), Chinese Application No. 202010772111.X, dated Sep. 18, 2020, 9 pages.

* cited by examiner

METHOD AND APPARATUS FOR MANUFACTURING MONOCRYSTALLINE SILICON

CROSS-REFERENCE TO RELATED APPLICATIONS

The present application claims priority to Chinese Patent Application No. 202010772111.X, filed on Aug. 4, 2020, the content of which is incorporated herein by reference in its entirety.

TECHNICAL FIELD

The present disclosure relates to the field of a solar cell and, in particular, to a method and an apparatus for manufacturing a monocrystalline silicon used in the solar cell.

BACKGROUND

A monocrystalline silicon (or a single crystal silicon) for preparing a solar cell is mainly manufactured by the Czochralski process. In the Czochralski process, a growth speed of the monocrystalline silicon is greatly affected by a longitudinal temperature gradient of a pulled crystal near a crystallizing interface. The greater the temperature gradient is, the faster the growth of the monocrystalline silicon crystal will be. To increase the longitudinal temperature gradient of the monocrystalline silicon crystal near the crystallizing interface, it is necessary to achieve quick heat dissipation for the pulled crystal. At present, a water-cooling heat shield may be arranged in a single crystal furnace so that the heat is quickly dissipated from the crystal.

During the crystal pulling in the Czochralski process, a thermal field may be designed to achieve the crystal pulling with a variable temperature gradient, thereby improving stability of a constant-diameter body growth process of the monocrystalline silicon and the growth speed of the pulled crystal under the premise of ensuring a success rate of seeding. However, when the crystal is pulled in a conventional thermal field, a distance between the water-cooling heat shield and a surface of silicon melt is fixed, which may cause the longitudinal temperature gradient of the monocrystalline silicon crystal cannot be further increased, thus resulting in a negative impact on the growth speed of the monocrystalline silicon.

SUMMARY

In view of this, the present disclosure provides a method and an apparatus for manufacturing a monocrystalline silicon, which can increase the longitudinal temperature gradient of the monocrystalline silicon crystal and the growth speed of the monocrystalline silicon.

In a first aspect of the present disclosure, a method for manufacturing a monocrystalline silicon with a Czochralski process is provided. The method includes the following steps:

step 1: providing a polycrystalline silicon and a dopant to a quartz crucible;

step 2: placing the quartz crucible in a single crystal furnace and vacuumizing the furnace, and melting the polycrystalline silicon under an atmosphere of a protective gas to obtain silicon melt;

step 3: after a temperature of the silicon melt is stable, immersing a seed crystal into the silicon melt to start a seeding process, during the seeding process, lifting a water-cooling heat shield in a direction away from a surface of the silicon melt to adjust a distance between a bottom of the water-cooling heat shield and the surface of the silicon melt to a first preset distance;

step 4: after the seeding process is completed, performing a shouldering process to continuously pull the crystal, and gradually increase a diameter of the pulled crystal to a preset width;

step 5: starting a constant-diameter body growth process, lowering the water-cooling heat shield in a direction towards the surface of the silicon melt to adjust the distance between the bottom of the water-cooling heat shield and the surface of the silicon melt to a second preset distance;

step 6: after the constant-diameter body growth process is completed, entering a tailing stage during which the diameter of the crystal is gradually reduced until the crystal is separated from the silicon melt; and step 7: cooling the pulled crystal to room temperature and taking out the cooled crystal from the single crystal furnace as the monocrystalline silicon.

In an embodiment, the first preset distance is in a range from 25 mm to 60 mm.

In an embodiment, during the seeding process, a seeding speed is in a range from 240 mm/h to 300 mm/h, a seeding length is in a range from 260 mm to 300 mm, and the diameter of the crystal is in a range from 5 mm to 8 mm.

In an embodiment, during performing the shouldering process to continuously pulling the crystal, a first pulling speed of the crystal is in a range from 50 mm/h to 80 mm/h, so that the diameter of the crystal is gradually increased to 230 mm-310 mm.

In an embodiment, the second preset distance is in a range from 10 mm to 40 mm.

In an embodiment, during the constant-diameter body growth process, a lowering speed of the water-cooling heat shield is in a range from 10 mm/h to 20 mm/h, a total lowering time of the water-cooling heat shield is less than 3 hours, and a second pulling speed of the crystal is in a range from 80 mm/h to 130 mm/h.

In an embodiment, a height difference between the first preset distance and the second preset distance is in a range from 15 mm to 50 mm.

In an embodiment, a third pulling speed of the crystal is in a range from 20 mm/h to 80 mm/h.

In a second aspect of the present disclosure, an apparatus for manufacturing a monocrystalline silicon is provided. The apparatus includes a single crystal furnace, a quartz crucible, a heater, a water-cooling heat shield, a heat insulation cylinder, a guide shell, a crystal pulling device, a connector, and a lifting bar for the water-cooling heat shield, wherein the connector is configured to operably connect the lifting bar to the guide shell in order to allow movement of the water-cooling heat shield relative to the guide shell.

In an embodiment, the connector includes a lifting limit portion, a support bar and a lifting buckle, two ends of the support bar are connected to the lifting limit portion and the guide shell, respectively, one end of the lifting buckle is fixedly connected to the lifting bar, and the other end of the lifting buckle is buckled on the support bar.

In an embodiment, the manufacturing the monocrystalline silicon further includes: providing a polycrystalline silicon and a dopant to the quartz crucible;

placing the quartz crucible in the single crystal furnace and vacuumizing the furnace, and melting the polycrystalline silicon under an atmosphere of a protective gas to obtain silicon melt;

after a temperature of the silicon melt is stable, immersing a seed crystal into the silicon melt to start a seeding process, during the seeding process, lifting the water-cooling heat shield in a direction away from a surface of the silicon melt to adjust a distance between a bottom of the water-cooling heat shield and the surface of the silicon melt to a first preset distance;

after the seeding process is completed, performing a shouldering process to continuously pull the crystal, and gradually increase a diameter of the pulled crystal to a preset width;

starting a constant-diameter body growth process, lowering the water-cooling heat shield in a direction towards the surface of the silicon melt to adjust the distance between the bottom of the water-cooling heat shield and the surface of the silicon melt to a second preset distance;

after the constant-diameter body growth process is completed, entering a tailing stage during which the diameter of the pulled crystal is gradually reduced until the pulled crystal is separated from the silicon melt; and cooling the pulled crystal to room temperature and taking out the cooled crystal from the single crystal furnace as the monocrystalline silicon.

In an embodiment, the first preset distance is in a range from 25 mm to 60 mm.

In an embodiment, during the seeding process, a seeding speed is in a range from 240 mm/h to 300 mm/h, a seeding length is in a range from 260 mm to 300 mm, and the diameter of the crystal is in a range from 5 mm to 8 mm.

In an embodiment, during performing the shouldering process to continuously pulling the crystal, a first pulling speed of the crystal is in a range from 50 mm/h to 80 mm/h, so that the diameter of the crystal is gradually increased to 230 mm-310 mm.

In an embodiment, the second preset distance is in a range from 10 mm to 40 mm.

In an embodiment, during the constant-diameter body growth process, a lowering speed of the water-cooling heat shield is in a range from 10 mm/h to 20 mm/h, a total lowering time of the water-cooling heat shield is less than 3 hours, and a second pulling speed of the crystal is in a range from 80 mm/h to 130 mm/h.

The technical solutions according to the present disclosure at least bring the following technical effects:

In the present disclosure, during the seeding process, the water-cooling heat shield is lifted upward to increase the distance between the bottom of the water-cooling heat shield and the surface of the silicon melt, thereby increasing the success rate of seeding. In the constant-diameter body growth process, the water-cooling heat shield is lowered to reduce the distance between the bottom of the water-cooling heat shield and the surface of the silicon melt, so that the growth of the crystal is more stable. Moreover, since the distance between the bottom of the water-cooling heat shield and the surface of the silicon melt becomes smaller, the heat absorption capacity of the water-cooling heat shield is enhanced, so that the temperature of the crystal rod is lowered, the longitudinal temperature gradient of the crystal rod is then increased, and the growth speed of the monocrystalline silicon is increased, thereby realizing the process of crystal pulling with the variable temperature gradient.

BRIEF DESCRIPTION OF DRAWINGS

In order to more clearly illustrate technical solutions of embodiments of the present disclosure or the technical solutions in the related art, the accompanying drawings used in the embodiments or the related art are briefly described below. The drawings described below are merely a part of the embodiments of the present disclosure. Based on these drawings, those skilled in the art can obtain other drawings without any creative effort.

DESCRIPTION OF EMBODIMENTS

In order to better understand technical solutions of the present disclosure, the technical solutions in the embodiments of the present disclosure are clearly and completely described in details with reference to the accompanying drawings.

It is appreciated that, the described embodiments are merely part of the embodiments of the present disclosure rather than all of the embodiments. All other embodiments obtained by those skilled in the art based on the embodiments of the present disclosure without paying creative effort shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a correlation relation of related objects, indicating that there may be three relations, e.g., A and/or B may indicate only A, both A and B, and only B. In addition, the symbol "/" in the context generally indicates that the relation between the objects before and after the "/" is an "or" relationship.

In the related art, a thermal field is generally designed to achieve the crystal pulling with a variable temperature gradient during the crystal pulling process, improving stability of the constant-diameter body growth process of the monocrystalline silicon and the growth speed of the pulled crystal under the premise of ensuring the success rate of seeding. However, when the crystal is pulled in a conventional thermal field, the distance between the water-cooling heat shield and the surface of silicon melt is fixed, which may cause the longitudinal temperature gradient of the crystal cannot be further increased, thus resulting in a negative impact on the growth speed of the monocrystalline silicon.

Figure 1A:
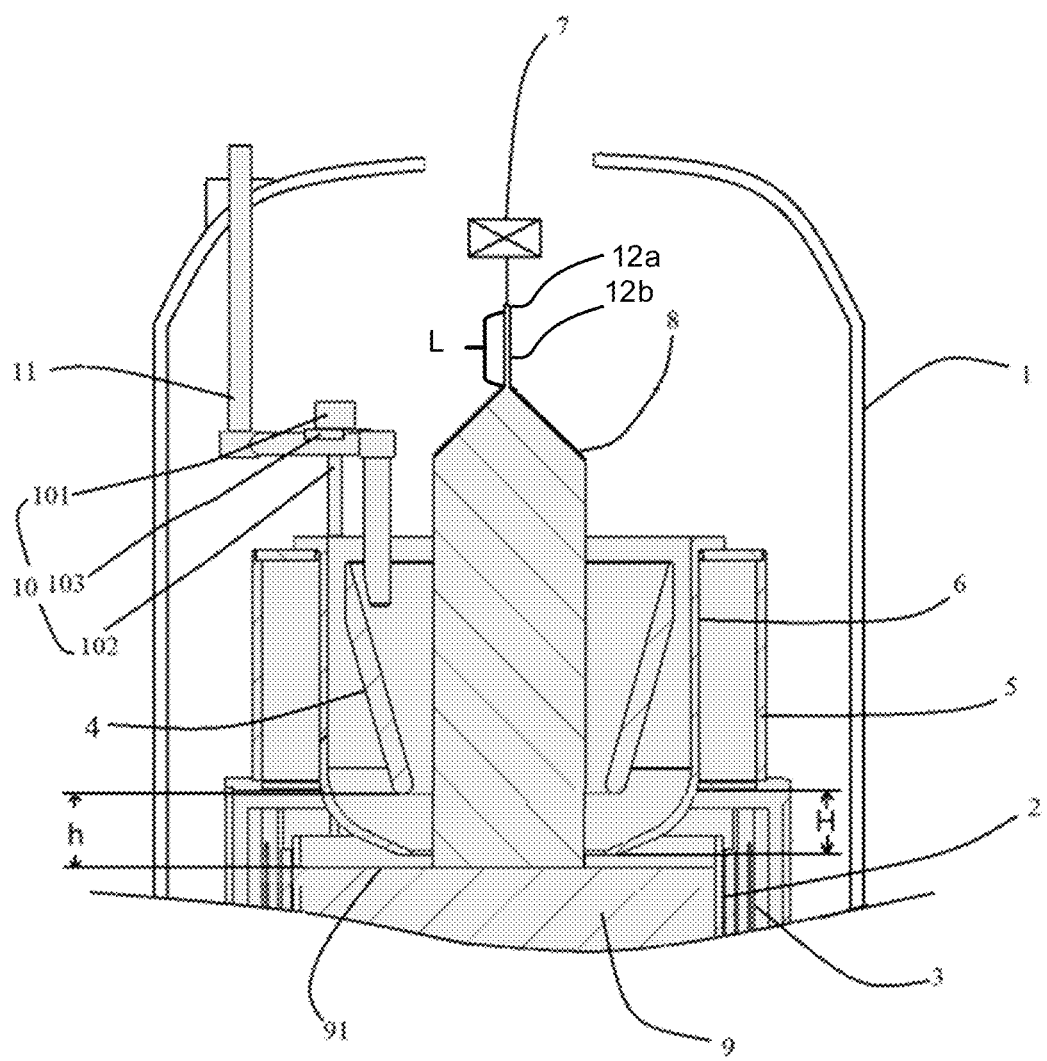
FIG. 1a is a structural schematic diagram showing an apparatus for manufacturing a monocrystalline silicon according to an embodiment of the present disclosure.

FIG. 1a is a structural schematic diagram showing an apparatus for manufacturing a monocrystalline silicon according to an embodiment of the present disclosure. As shown in FIG. 1a, the apparatus for manufacturing a monocrystalline silicon includes a single crystal furnace 1, a quartz crucible 2, a heater 3, a water-cooling heat shield 4, a heat insulation cylinder 5, a guide shell 6, a crystal pulling device 7 and crystal 8. The crystal pulling device 7 is configured to pull the crystal 8 (i.e., the single crystal silicon crystal).

The heater 3 is configured to heat polycrystalline silicon raw material(s) and dopants in the quartz crucible 2 so that the polycrystalline silicon raw material is melted to form silicon melt 9. The water-cooling heat shield 4 can lower temperature at surface of the crystal 8, increase temperature gradient within the crystal 8, which can greatly increase growth speed of the crystal without changing temperature gradient of the silicon melt 9.

Since the silicon wafer has a strict requirement on oxygen content to avoid serious accidents such as burning of a manufactured chip during use, it is necessary to reduce the oxygen concentration in the silicon melt, the oxygen elements in the silicon melt mostly exist in a form of Si—O. A protective gas (argon and/or nitrogen) is converged to the center of the quartz crucible 2 through the guide shell 6, thereby accelerating volatilization of Si—O and thus greatly reducing the oxygen concentration in the silicon melt. Moreover, the guide shell 6 may also function as heat shielding, and the collected protective gas can accelerate the cooling of the crystal, to increase the axial temperature gradient of the crystal and growth speed of the crystal.

In the monocrystalline silicon growth device of the related art, a water-cooling heat shield 4 is connected to a guide shell 6, and their relative position is unchanged, that is, a distance H of the guide shell 6 penetrating into the heater 3 is unchanged, and a distance h between bottom of the water-cooling heat shield 4 and a surface 91 of silicon melt 9 in the quartz crucible 2 is also unchanged. If the success rate of seeding of the monocrystalline silicon is lower than a preset distance h during the manufacturing process or a break rate is high during a constant-diameter body growth process, it is difficult to adjust the value of h. Moreover, if the distance h between bottom of the water-cooling heat shield 4 and the surface 91 of the silicon melt 9 is required to be changed, the structural size of the guide shell 6 or the size of thermal field shall be changed accordingly, which is cumbersome and expensive.

In some embodiments of the present disclosure, in the seeding process, the distance h between the bottom of the water-cooling heat shield 4 and the surface 91 of the silicon melt 9 is increased, so that heat absorption capacity of the water-cooling heat shield 4 is weakened at the surface of the silicon melt and thus the temperature at the growth interface is more stable, thereby improving the success rate of seeding. In the constant-diameter body growth process, the distance h between the bottom of the water-cooling heat shield 4 and the surface 91 of the silicon melt 9 is reduced, so that crystal growth is more stable, heat absorption capacity of the water-cooling heat shield 4 for the crystal rod is enhanced, and the temperature of the crystal rod becomes lower, thereby increasing the longitudinal temperature gradient of the crystal rod, and realizing the crystal pulling with the variable temperature gradient.

However, in the related art, the guide shell 6 and the water-cooling heat shield 4 are located at preset fixed positions, so that h value cannot be adjusted, which is adverse to improving the success rate of seeding.

In the present disclosure, the water-cooling heat shield 4 has a flat bottom, so that the heat absorption capacity of the water-cooling heat shield 4 for the crystal rod can be further enhanced compared with an oblique bottom, without changing the minimum distance between the water-cooling heat shield 4 and the surface of the silicon melt 9.

In an embodiment of the present disclosure, the apparatus for manufacturing a monocrystalline silicon further includes a connector 10 and a water-cooling heat shield lifting bar 11 configured to lift the water-cooling heat shield 4. One end of the water-cooling heat shield lifting bar 11 is fixed on the furnace wall of the single crystal furnace 1, that is, it is connected to a motor on the furnace wall of the single crystal furnace 1. The other end of the water-cooling heat shield lifting bar 11 is connected to the water-cooling heat shield 4, so that the water-cooling heat shield 4 can be lifted or lowered under control of rotation of a motor. In some embodiments, the motor can be controlled locally or remotely through a wired and/or wireless signal. For example, a control signal can be remotely sent to a signal receiving terminal of the motor by a user terminal device, so that rotation of the motor can be controlled.

The connector 10 is configured to connect the water-cooling heat shield lifting bar 11 to the guide shell 6. In an embodiment, the connector 10 includes a lifting limit portion 101, a support bar 102 and a lifting buckle 103. Two ends of the support bar 102 are connected to the lifting limit portion 101 and the guide shell 6, respectively. One end of the lifting buckle 103 is fixedly connected to the water-cooling heat shield lifting bar 11, and the other end of the lifting buckle 103 is buckled on the support bar 102.

In some embodiments, when the water-cooling heat shield lifting bar 11 is lifted upwards, the distance between the guide shell 6 and the surface of the silicon melt remains unchanged, that is, lifting of the water-cooling heat shield does not drive the guide shell 6 upward. When the lifting buckle 103 is also lifted along the support bar 102 to the lifting limit portion 101, if the water-cooling heat shield lifting bar 11 is continuously lifted upwards, the lifting buckle 103 drives the lifting limit portion 101 to move upwards and simultaneously drives the guide shell 6 to move upwards.

When the water-cooling heat shield lifting bar 11 is lowered, the lifting buckle 103 is also lowered along the support bar 102 to a flange of the guide shell 6, and the guide shell 6 is driven to move downwards. When the guide shell 6 is lowered to a position where the flange of the guide shell 6 abuts against the heat insulation cylinder 5, and the position of the guide shell 6 does not change anymore. At this time, the water-cooling heat shield lifting bar 11 is continuously lowered, and the water-cooling heat shield 4 is continuously lowered either, so that the water-cooling heat shield 4 moves downwards independently relative to the guide shell 6. Therefore, the distance between the bottom of the water-cooling heat shield 4 and the surface of the silicon melt is further reduced, and the heat absorbing capacity of the water-cooling heat shield from the crystal rod is improved, thereby realizing the crystal pulling with the variable temperature gradient.

The water-cooling heat shield 4 can adjust the distance between the water-cooling heat shield 4 and the surface of the silicon melt up and down under the action of the water-cooling heat shield lifting bar 11 and the connector 10. In this embodiment, the distance between the water-cooling heat shield 4 and the surface of the silicon melt is adjustable in a range from 0 mm to 80 mm.

As shown in FIG. 1a, in the seeding process, the water-cooling heat shield lifting bar 11 lifts the water-cooling heat shield 4 in a direction away from the surface of the silicon melt, and the guide shell 6 is lifted under the action of the connector 10 as the water-cooling heat shield lifting bar 11 rises, so that the distance between the bottom of the water-cooling heat shield 4 and the surface of the silicon melt is adjusted to a first preset distance. In an embodiment, the first preset distance is in a range from 25 mm to 60 mm. The first preset distance is set such that the water-cooling heat shield is far away from the high-temperature silicon melt during the seeding process, so as to avoid temperature fluctuations. Therefore, the temperature at the growth interface is stable, and the success rate of seeding is high.

Figure 1B:
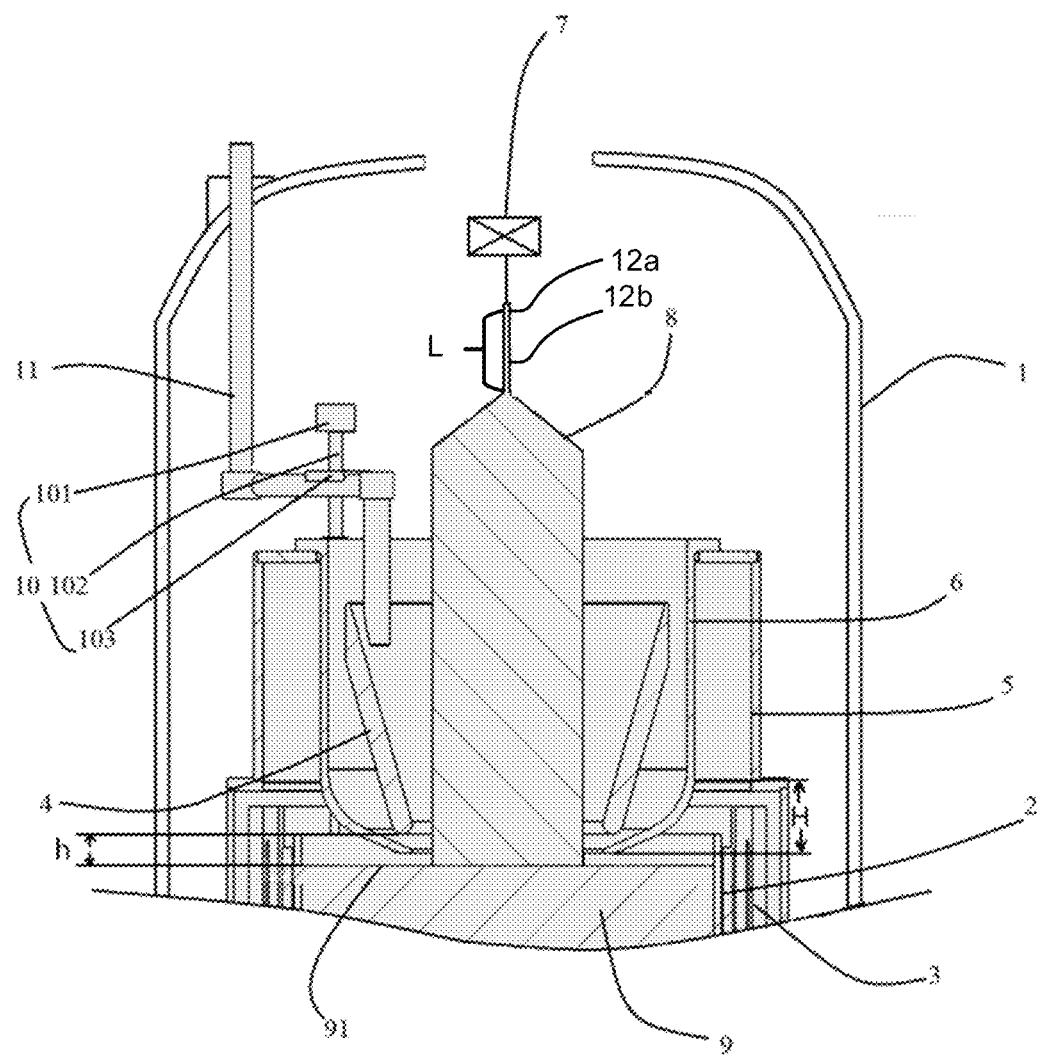
FIG. 1b is a structural schematic diagram showing an apparatus for manufacturing a monocrystalline silicon according to another embodiment of the present disclosure.

As shown in FIG. 1b, in the constant-diameter body growth process, the water-cooling heat shield lifting bar 11 drives the water-cooling heat shield 4 to move in the direction away from the surface of the silicon melt, and the guide shell 6 also is also lowered as the water-cooling heat shield lifting bar 11 moves until the flange of the guide shell 6 abuts against the heat insulation cylinder 5. The water-cooling heat shield 4 is continuously lowered in a direction close to the surface of the silicon melt, so that the distance between the bottom of the water-cooling heat shield 4 and the surface of the silicon melt is adjusted to a second preset distance. In an embodiment, the second preset distance is in a range from 10 mm to 40 mm. At this time, the water-cooling heat shield 4 is lowered relative to the guide shell 6, so that the distance between the bottom of the water-cooling heat shield 4 and the surface of the silicon melt is further reduced, and the heat absorbing capacity of the water-cooling heat shield from the crystal rod is improved, thereby realizing the crystal pulling with the variable temperature gradient.

In an embodiment, a height difference between the first preset distance and the second preset distance is in a range from 15 mm to 50 mm.

Figure 2:
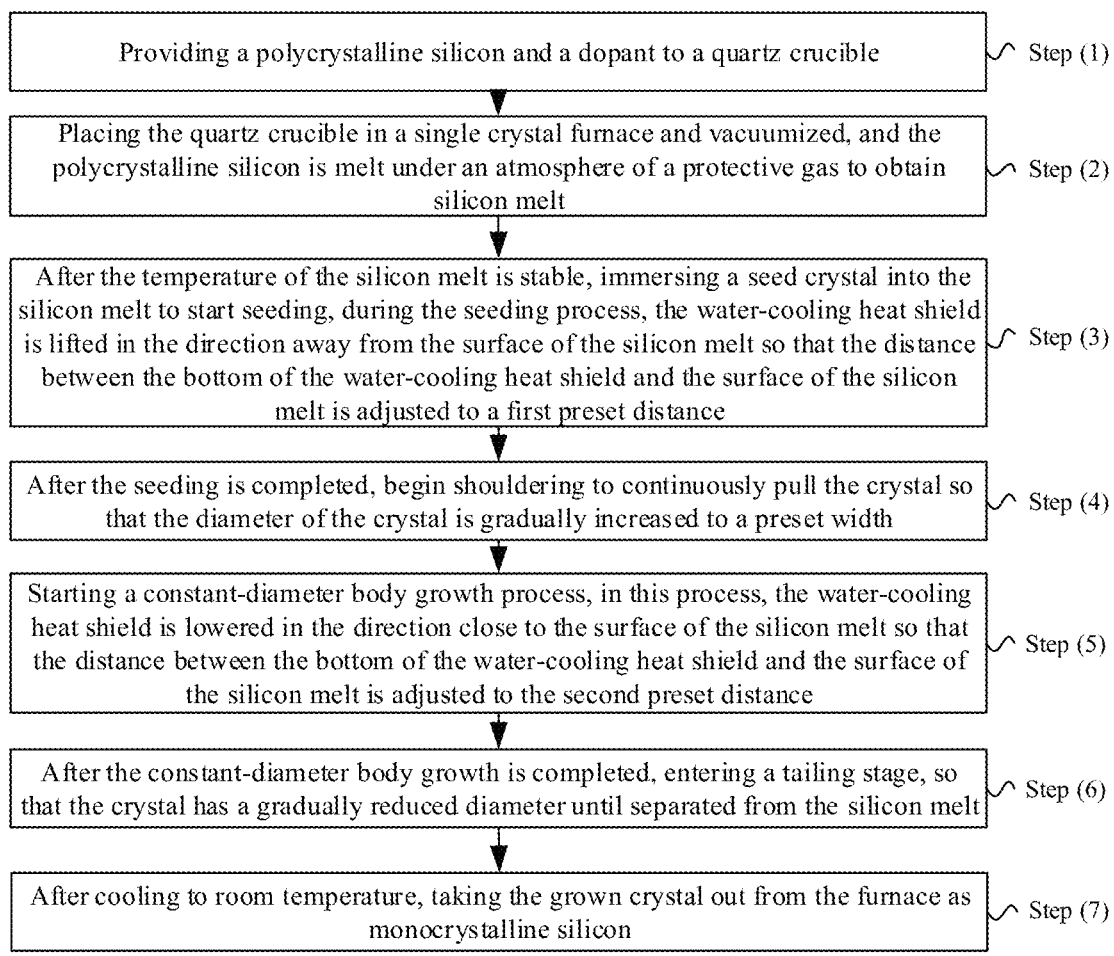
FIG. 2 is a schematic flowchart showing a method for manufacturing a monocrystalline silicon according to an embodiment of the present disclosure.

FIG. 2 is a schematic flowchart showing a method for manufacturing a monocrystalline silicon according to an embodiment of the present disclosure. As shown in FIG. 2, the present disclosure provides a method for manufacturing a monocrystalline silicon with a Czochralski process, and the method includes the following steps.

Step (1) Providing a polycrystalline silicon and a dopant to a quartz crucible.

Step (2) Placing the quartz crucible in a single crystal furnace and vacuumized, and the polycrystalline silicon is melt under an atmosphere of a protective gas to obtain silicon melt.

Step (3) After the temperature of the silicon melt is stable, immersing a seed crystal 12a into the silicon melt to start seeding. During the seeding process, the water-cooling heat shield is lifted in the direction away from the surface of the silicon melt so that the distance between the bottom of the water-cooling heat shield and the surface of the silicon melt is adjusted to a first preset distance.

Step (4) After the seeding is completed, begin shouldering to continuously pull the crystal so that the diameter of the crystal is gradually increased to a preset width. For example, the preset width may be in a range from 100 mm to 400 mm, such as 230 mm, 250 mm, 305 mm.

Step (5) Starting a constant-diameter body growth process. In the constant-diameter body growth process, the water-cooling heat shield is lowered in the direction close to the surface of the silicon melt so that the distance between the bottom of the water-cooling heat shield and the surface of the silicon melt is adjusted to the second preset distance.

Step (6) After the constant-diameter body growth is completed, entering a tailing stage, so that the crystal has a gradually reduced diameter until it is separated from the silicon melt.

Step (7) After cooling to room temperature, taking the grown crystal out from the furnace as monocrystalline silicon.

In this solution, during the seeding process, the water-cooling heat shield is lifted upward to increase the distance between the bottom of the water-cooling heat shield and the surface of the silicon melt, thereby increasing the success rate of seeding. In the constant-diameter body growth process, the water-cooling heat shield is lowered to reduce the distance between the bottom of the water-cooling heat shield and the surface of the silicon melt, so that the growth of the crystal is more stable. Moreover, since the distance between the bottom of the water-cooling heat shield and the surface of the silicon melt becomes smaller, the heat absorption capacity of the water-cooling heat shield is enhanced, so that the temperature of the crystal rod is lowered, the longitudinal temperature gradient of the crystal rod is then increased, and the growth speed of the monocrystalline silicon is increased, thereby realizing the process of crystal pulling with the variable temperature gradient.

In step (2), the protective gas is argon and/or nitrogen.

In step (3), during the seeding process, a seeding speed is in a range from 240 mm/h to 300 mm/h, a seeding length "L" is in a range from 260 mm to 300 mm, and the crystal diameter is in a range from 5 mm to 8 mm.

In an embodiment, the seeding speed may be 240 mm/h, 250 mm/h, 260 mm/h, 270 mm/h, 280 mm/h, 290 mm/h or 300 mm/h, which are not limited thereto.

In the seeding process, the diameter of the crystal 12b may be 5 mm, 6 mm, 7 mm, or 8 mm, etc., and the length "L" of the crystal 12b can be 260 mm, 270 mm, 280 mm, 290 mm or 300 mm, etc., which are not limited thereto.

During the seeding process, the distance between the bottom of the water-cooling heat shield 4 and the surface 91 of the silicon melt is adjusted to the first preset distance. The first preset distance may be in a range from 25 mm to 60 mm, e g, 25 mm, 30 mm, 35 mm, 40 mm, 45 mm, 50 mm, 55 mm or 60 mm. In an embodiment, the distance between the bottom of the water-cooling heat shield 4 and the surface 91 of the silicon melt is adjusted to 60 mm to increase the distance between the bottom of the water-cooling heat shield and the surface of silicon melt, thereby improving the success rate of seeding.

In step (3), the temperature (set point) in the single crystal furnace is in a range from 1250° C. to 1300° C. For example, the temperature in the single crystal furnace may be 1250° C., 1255° C., 1260° C., 1265° C., 1270° C., 1275° C., 1280° C., 1285° C., 1290° C., 1295° C., or 1300° C. In an embodiment, the temperature in the single crystal furnace is 1300sp. It shall be understood that, a suitable seeding temperature may effectively improve the success rate of seeding. The temperature in the single crystal furnace may also be other values, which are not limited thereto.

In step (4), during the shouldering process, the first pulling speed of the crystal is in a range from 50 mm/h to 80 mm/h, so that the diameter of the crystal is gradually increased to 230 mm to 310 mm.

In an embodiment, the first pulling speed may be 50 mm/h, 60 mm/h, 70 mm/h, or 80 mm/h, etc., and the diameter of the crystal is gradually increased to 230 mm, 240 mm, 250 mm, 260 mm, 270 mm, 280 mm, 290 mm, 300 mm or 310 mm, etc., which are not limited thereto. It shall be understood that, in the shouldering process, heat dissipation volume of the crystal is small, and the crystal has not entered into the water-cooling heat shield so that heat of the crystal cannot be effectively taken away by the water-cooling heat shield. Therefore, the temperature gradient inside the crystal is small, so that the growth speed of the crystal is slow and the pulling speed of the crystal is also slow in order to ensure stability of crystal pulling. Moreover, throughout the entire shouldering process, the temperature in the single crystal furnace may be gradually reduced and shall not be increased.

A range of the diameter of the crystal may be designed and controlled according to the size requirements of the solar cell on the silicon wafer, which is not limited thereto.

In step (5), during the constant-diameter body growth process, the distance between the bottom of the water-cooling heat shield 4 and the surface 91 of the silicon melt is adjusted to the second preset distance. The second preset distance is in a range from 10 mm to 40 mm, e.g., it may be 10 mm, 15 mm, 20 mm, 25 mm, 30 mm, 35 mm or 40 mm. In an embodiment, the distance between the bottom of the water-cooling heat shield 4 and the surface 91 of the silicon melt is adjusted to 10 mm so that the distance between the bottom of the water-cooling heat shield and the surface 91 of the silicon melt is reduced, thereby improving the heat absorbing capacity of the water-cooling heat shield from the crystal rod, and thereby realizing the crystal pulling with the variable temperature gradient.

In an embodiment, the distance between the water-cooling heat shield 4 and the surface of the silicon melt is adjustable in a range from 0 mm to 80 mm, e g, it may be 5 mm, 10 mm, 20 mm, 30 mm, 40 mm, 50 mm, 60 mm, 70 mm or 80 mm, which are not limited thereto. A height difference between the first preset distance and the second preset distance is in a range from 15 mm to 50 mm.

In an embodiment, during the constant-diameter body growth process, a lowering speed of the water-cooling heat shield is in a range from 10 mm/h to 20 mm/h, a total lowering time of the water-cooling heat shield is less than 3 hours, and the second pulling speed of the crystal is in a range from 80 mm/h to 130 mm/h.

In an embodiment, the lowering speed of the water-cooling heat shield 4 may be 10 mm/h, 12 mm/h, 14 mm/h, 16 mm/h, 18 mm/h or 20 mm/h. The total lowering time may be 1 hour, 1.5 hours, 2 hours, or 2.5 hours, etc.

The second pulling speed may be 80 mm/h, 90 mm/h, 100 mm/h, 110 mm/h, 120 mm/h, or 130 mm/h, etc., which are not limited thereto. It shall be understood that, during the constant-diameter body growth process, the crystal has begun to enter the water-cooling heat shield area or completely immersed into the water-cooling heat shield area. The water-cooling heat shield may quickly absorb the heat of the crystal, so that the temperature gradient of the crystal rod becomes larger. The growth speed of the crystal is increased in order to ensure the growth efficiency in this process, thereby increasing the pulling speed of the crystal.

In step (6), after the constant-diameter body growth process is completed, it enters the tailing stage, so that the diameter of the crystal is gradually reduced until the crystal is separated from the silicon melt. In this process, a third pulling speed of the crystal is in a range from 20 mm/h to 80 mm/h, e.g., the third pulling speed may be 20 mm/h, 30 mm/h, 40 mm/h, 50 mm/h, 60 mm/h, 70 mm/h or 80 mm/h. In the tailing stage, the temperature of the single crystal furnace rises rapidly.

Example 1

Step (1) Providing a polycrystalline silicon raw material and a dopant to a quartz crucible.

Step (2) Placing the quartz crucible in a single crystal furnace and vacuumized, and the polycrystalline silicon raw material is melt under an atmosphere of a protective gas to obtain silicon melt.

Step (3) After the temperature of the silicon melt is stable, immersing a seed crystal into the silicon melt by the pulling device to start seeding. During seeding, the temperature in the single crystal furnace is set as 1300° C., the seeding speed is controlled as 250 mm/h, the diameter of the crystal is 6 mm, and the length of the crystal is 280 mm. During the seeding process, the water-cooling heat shield is lifted in the direction away from the surface of the silicon melt so that the distance between the bottom of the water-cooling heat shield and the surface of the silicon melt is adjusted to 50 mm.

Step (4) After the seeding is completed, begin shouldering to continuously pull the crystal, and the pulling speed is lowered to 50 mm/h, so that diameter of the crystal is gradually increased to 250 mm.

Step (5) Starting a constant-diameter body growth process. In the constant-diameter body growth process, the water-cooling heat shield is lowered in the direction close to the surface of the silicon melt, so that the distance between the bottom of the water-cooling heat shield and the surface of the silicon melt is adjusted to 20 mm, the lowering speed of the water-cooling heat shield is 15 mm/h, and the pulling speed of the crystal is 100 mm/h.

Step (6) After the constant-diameter body growth is completed, entering a tailing stage, and the pulling speed of the crystal is controlled as 50 mm/h, so that the crystal has a gradually reduced diameter until it is separated from the silicon melt.

Step (7) After cooling to room temperature, taking the grown crystal out from the furnace as monocrystalline silicon.

In the method for manufacturing a monocrystalline silicon according to the present disclosure, a 26-inch thermal field is taken as an example, in its crystal pulling process with the variable temperature gradient, the success rate of seeding may be increased by 10%-15%. In the constant-diameter body growth stage, the value of h may be reduced. The crystal pulling speed may be increased by 5%-15% by only using the crystal pulling process with the variable temperature gradient without changing the thermal field.

In the method and the apparatus for manufacturing a monocrystalline silicon, in the seeding process, the water-cooling heat shield is lifted upwards to increase the distance between the bottom of the water-cooling heat shield and the surface of the silicon melt, thereby increasing the success rate of seeding. In the constant-diameter body growth process, the water-cooling heat shield is lowered to reduce the distance between the bottom of the water-cooling heat shield and the surface of the silicon melt, so that the crystal growth process is more stable. Moreover, since the distance between the bottom of the water-cooling heat shield and the surface of the silicon melt becomes smaller, the heat absorption capacity of the water-cooling heat shield is enhanced, so that the temperature of the crystal rod becomes lower, the longitudinal temperature gradient of the crystal rod is then increased, and the growth speed of the monocrystalline silicon is increased, thereby realizing the process of crystal pulling with the variable temperature gradient.

The above embodiments of the present disclosure are several embodiments, but not intended to limit the scope of the claims. Any change and modification may be made by those skilled in the art without departing from the scope of the present application. The protection scope of the present disclosure is defined by the appended claims.

What is claimed is:

1. A method for manufacturing a monocrystalline silicon, comprising:

providing a polycrystalline silicon and a dopant to a quartz crucible;

placing the quartz crucible in a single crystal furnace and vacuumizing the furnace, and melting the polycrystalline silicon under an atmosphere of a protective gas to obtain a silicon melt;

after a temperature of the silicon melt is stable, immersing a seed crystal into the silicon melt to start a seeding process, during the seeding process, lifting a water-cooling heat shield having a bottom in a direction away from a surface of the silicon melt to adjust a distance between the bottom of the water-cooling heat shield and the surface of the silicon melt to a first preset distance, wherein the first preset distance is in a range from 40 mm to 55 mm, and a speed of the seeding process is in a range from 240 mm/h to 290 mm/h, and wherein the seeding process grows the seed crystal to form a crystal having a seeding length;

after the seeding process is completed, performing a shouldering process to continuously pull the crystal with a first pulling speed in a range from 50 mm/h to 80 mm/h, and increase a diameter of the pulled crystal to a range from 230 mm to 310 mm;

starting a constant-diameter body growth process, lowering the water-cooling heat shield in a direction towards the surface of the silicon melt so that the water-cooling heat shield is lowered relative to a guide shell until the distance between the bottom of the water-cooling heat shield and the surface of the silicon melt to a second preset distance in a range from 10 mm to 25 mm, wherein the guide shell is configured to converge the protective gas to a center of the quartz crucible;

after the constant-diameter body growth process is completed, entering a tailing stage during which the diameter of the pulled crystal is reduced until the pulled crystal is separated from the silicon melt; and cooling the pulled crystal to room temperature and taking out the cooled crystal from the single crystal furnace as the monocrystalline silicon, wherein, during the seeding process, the lifting the water-cooling heat shield in the direction away from the surface of the silicon melt includes: firstly lifting the water-cooling heat shield driven by a water-cooling heat shield lifting bar independently relative to the guide shell, and then simultaneously lifting the water-cooling heat shield driven by the water-cooling heat shield lifting bar and lifting the guide shell driven by a connector connected between the water-cooling heat shield lifting bar and the guide shell, and wherein, during the constant-diameter body growth process, the lowering the water-cooling heat shield in the direction towards the surface of the silicon melt includes: firstly simultaneously lowering the water-cooling heat shield driven by the water-cooling heat shield lifting bar and lowering the guide shell driven by the connector, and after the guide shell abuts against a heat insulation cylinder, continuously lowering the water-cooling heat shield downward independently relative to the guide shell.

2. The method for manufacturing a monocrystalline silicon according to claim 1, wherein during the seeding process, the seeding length is in a range from 260 mm to 300 mm, and the diameter of the crystal is in a range from 5 mm to 8 mm.

3. The method for manufacturing a monocrystalline silicon according to claim 1, wherein the second preset distance is 10 mm.

4. The method for manufacturing a monocrystalline silicon according to claim 3, wherein during the constant-diameter body growth process, a lowering speed of the water-cooling heat shield is in a range from 10 mm/h to 20 mm/h, a total lowering time of the water-cooling heat shield is less than 3 hours, and a second pulling speed of the crystal is in a range from 80 mm/h to 130 mm/h.

5. The method for manufacturing a monocrystalline silicon according to claim 1, wherein during the constant-diameter body growth process, a lowering speed of the water-cooling heat shield is in a range from 10 mm/h to 20 mm/h, a total lowering time of the water-cooling heat shield is less than 3 hours, and a second pulling speed of the crystal is in a range from 80 mm/h to 130 mm/h.

6. The method for manufacturing a monocrystalline silicon according to claim 1, wherein in the tailing stage, a height difference between the first preset distance and the second preset distance is in a range from 15 mm to 45 mm.

7. The method for manufacturing a monocrystalline silicon according to claim 1, wherein a third pulling speed of the crystal during the tailing stage is in a range from 20 mm/h to 80 mm/h.

8. The method for manufacturing a monocrystalline silicon according to claim 1, wherein the water-cooling heat shield lifting bar, configured for lifting and lowering the water-cooling heat shield, is connected to the guide shell by a connector, and the connector is configured to provide simultaneous lifting of the water-cooling heat shield and guide shell, independent lifting of the water-cooling heat shield with respect to the guide shell, independent lowering of the water-cooling heat shield with respect to the guide shell, and simultaneous lowering of the water-cooling heat shield and guide shell.

9. The method for manufacturing a monocrystalline silicon according to claim 8, wherein the connector includes:
a lifting limit portion;
a support bar; and
a lifting buckle, wherein a first end of the support bar is connected to the lifting limit portion and a second end of the support bar is connected to the guide shell, and wherein a first end of the lifting buckle is connected to the water-cooling heat shield lifting bar and a second end of the lifting buckle is buckled on the support bar.

10. The method for manufacturing a monocrystalline silicon according to claim 9, wherein during the seeding process, the lifting the water-cooling heat shield in the direction away from the surface of the silicon melt further includes:
raising the lifting buckle along the support bar to the lifting limit portion; and
wherein during the constant-diameter body growth process, the lowering the water-cooling heat shield in the direction towards the surface of the silicon melt further includes:
lowering the lifting buckle along the support bar to a flange of the guide shell.

* * * * *